United States Patent
Shih et al.

(10) Patent No.: US 6,559,497 B2
(45) Date of Patent: May 6, 2003

(54) MICROELECTRONIC CAPACITOR WITH BARRIER LAYER

(75) Inventors: Wong-Cheng Shih, Kaohsiung (TW); Tai Bor Wu, Hsin-chu (TW); Chich Shang Chang, Ba-Teh (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/947,786

(22) Filed: Sep. 6, 2001

(65) Prior Publication Data

US 2003/0047770 A1 Mar. 13, 2003

(51) Int. Cl.[7] .................. H01L 31/119; H01L 27/108; H01L 29/76; H01L 29/94
(52) U.S. Cl. ........................ 257/306; 257/295
(58) Field of Search .................. 257/295–310, 257/530–535; 438/3, 240–241, 253–254, 396–398

(56) References Cited

U.S. PATENT DOCUMENTS

| | | |
|---|---|---|
| 5,573,979 A | 11/1996 | Tsu et al. |
| 5,716,875 A * | 2/1998 | Jones et al. .............. 438/3 |
| 5,976,928 A | 11/1999 | Kirlin et al. |
| 6,043,529 A | 3/2000 | Hartner et al. |
| 6,238,934 B1 * | 5/2001 | Yang .............. 438/3 |
| 6,342,712 B1 * | 1/2002 | Miki et al. .......... 257/295 |

* cited by examiner

Primary Examiner—Cuong Quang Nguyen
(74) Attorney, Agent, or Firm—Tung & Associates

(57) ABSTRACT

Within a method for fabricating a capacitor structure and a capacitor structure fabricated employing the method, there is provided a conductor barrier layer formed upon an upper capacitor plate formed within the capacitor structure. There is also provided a silicon layer formed upon the conductor barrier layer. The conductor barrier layer and the silicon layer provide for enhanced interdiffusion stability and enhanced delamination stability with respect to the upper capacitor plate, and thus enhanced reliability and performance of the capacitor structure.

6 Claims, 2 Drawing Sheets

MICROELECTRONIC CAPACITOR WITH BARRIER LAYER

BACKGROUND OF THE INVENTION

1. Field of the Invention

The present invention relates generally to capacitor structures formed within microelectronic fabrications. More particularly, the present invention relates to passivated capacitor structures formed within microelectronic fabrications.

2. Description of the Related Art

Microelectronic fabrications are formed from microelectronic substrates over which are formed patterned microelectronic conductor layers which are separated by microelectronic dielectric layers.

Common in the art of microelectronic fabrication, and in particular in the art of semiconductor integrated circuit microelectronic memory fabrication, is the use and the fabrication of memory cell structures, and in particular dynamic random access memory (DRAM) cell structures. Dynamic random access memory (DRAM) cell structures typically comprise a field effect transistor (FET) device formed within and upon a semiconductor substrate, where one of a pair of source/drain regions within the field effect transistor (FET) device has formed thereover and electrically connected therewith a storage capacitor. Within a dynamic random access memory (DRAM) cell structure, a gate electrode of the field effect transistor (FET) device serves as a wordline which provides a switching function for charge introduction into and retrieval from the storage capacitor, while the other of the pair of source/drain regions within the field effect transistor (FET) device serves as a contact for a bitline conductor layer which introduces or retrieves charge with respect to the storage capacitor.

While the dynamic random access memory (DRAM) cell structure has clearly become ubiquitous in the art of semiconductor integrated circuit microelectronic fabrication, and is thus essential in the art of semiconductor integrated circuit microelectronic fabrication, the dynamic random access memory (DRAM) cell structure is nonetheless not entirely without problems in the art of semiconductor integrated circuit microelectronic memory fabrication.

In that regard, as semiconductor integrated circuit microelectronic fabrication integration levels have increased and semiconductor device and patterned conductor layer dimensions have decreased, it has become increasingly difficult in the art of semiconductor integrated circuit microelectronic fabrication, and in particular in the art of semiconductor integrated circuit microelectronic memory fabrication, to reliably fabricate within dynamic random access memory (DRAM) cell structures storage capacitors with enhanced performance.

It is thus desirable in the art of microelectronic fabrication, and in particular in the art of semiconductor integrated circuit microelectronic memory fabrication, to provide methods and materials through which there may be reliably fabricated, with enhanced performance, capacitor structures.

It is towards the foregoing object that the present invention is directed.

Various methods have been disclosed in the art of microelectronic fabrication for forming, with desirable properties, capacitor structures.

Included among the methods, but not limited among the methods, are methods disclosed within: (1) Tsu et al., in U.S. Pat. No. 5,573,979 (a method for forming a capacitor structure with a lower capacitor plate having a sloped surface, such as to avoid capacitor dielectric layer cracking when forming thereupon a capacitor dielectric layer); (2) Kirlin et al., in U.S. Pat. No. 5,976,928 (a chemical mechanical polish (CMP) planarizing method for forming, with enhanced fabrication efficiency, a ferroelectric capacitor structure within a microelectronic fabrication); and (3) Hartner et al., in U.S. Pat. No. 6,043,529 (a method for forming a capacitor structure with enhanced reliability by forming annularly surrounding a barrier layer interposed between a conductor stud layer and a lower capacitor plate layer within the capacitor structure an annular silicon nitride layer).

Desirable in the art of microelectronic fabrication, and in particular in the art of semiconductor integrated circuit microelectronic memory fabrication, are additional methods and materials which may be employed for readily fabricating, with enhanced performance, capacitor structures.

It is towards the foregoing object that the present invention is directed.

SUMMARY OF THE INVENTION

A first object of the invention is to provide a capacitor structure for use within a microelectronic fabrication.

A second object of the present invention is to provide a capacitor structure in accord with the first object of the present invention, wherein the capacitor structure is reliably fabricated with enhanced performance.

In accord with the objects of the present invention, there is provided by the present invention a method for fabricating a capacitor structure, and a capacitor structure fabricated employing the method.

To practice the method of the present invention, there is first provided a substrate. There is then formed over the substrate a first capacitor plate. There is then formed upon the first capacitor plate a capacitor dielectric layer. There is then formed upon the capacitor dielectric layer a second capacitor plate. Finally, there is then formed upon the second capacitor plate a conductor barrier layer.

There is provided by the present invention a capacitor structure for use within a microelectronic fabrication, wherein the capacitor structure is readily fabricated with enhanced performance.

The present invention realizes the foregoing objects by forming upon an upper capacitor plate within a capacitor structure within a microelectronic fabrication a conductor barrier layer. The conductor barrier layer provides for attenuated interdiffusion and enhanced adhesion of the upper capacitor plate with respect to adjacent layers within the microelectronic fabrication within which is formed the capacitor structure.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a capacitor structure for use within a microelectronic fabrication, wherein the capacitor structure is readily fabricated with enhanced performance.

The present invention realizes the foregoing object by forming upon an upper capacitor plate within a capacitor structure within a microelectronic fabrication a conductor barrier layer. Within the present invention, the conductor barrier layer provides for attenuated interdiffusion and enhanced adhesion of the upper capacitor plate with respect to adjacent layers within the microelectronic fabrication within which is formed the capacitor structure.

Although the preferred embodiment of the present invention illustrates the present invention most particularly within the context of a storage capacitor formed within a dynamic random access memory (DRAM) cell within a semiconductor integrated circuit microelectronic memory fabrication, the present invention may nonetheless be employed for forming capacitor structures other than storage capacitor structures, within microelectronic fabrications other than semiconductor integrated circuit microelectronic fabrications.

In that regard, the present invention may be employed for forming capacitor structures and devices including but not limited to electrical signal storage capacitor structures and devices and electrical signal processing capacitor structures and devices. Similarly, such capacitor structures and devices may be formed within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages in forming, in accord with a preferred embodiment of the present invention, a storage capacitor within a dynamic random access memory (DRAM) cell within a semiconductor integrated circuit microelectronic fabrication.

Figure 1:
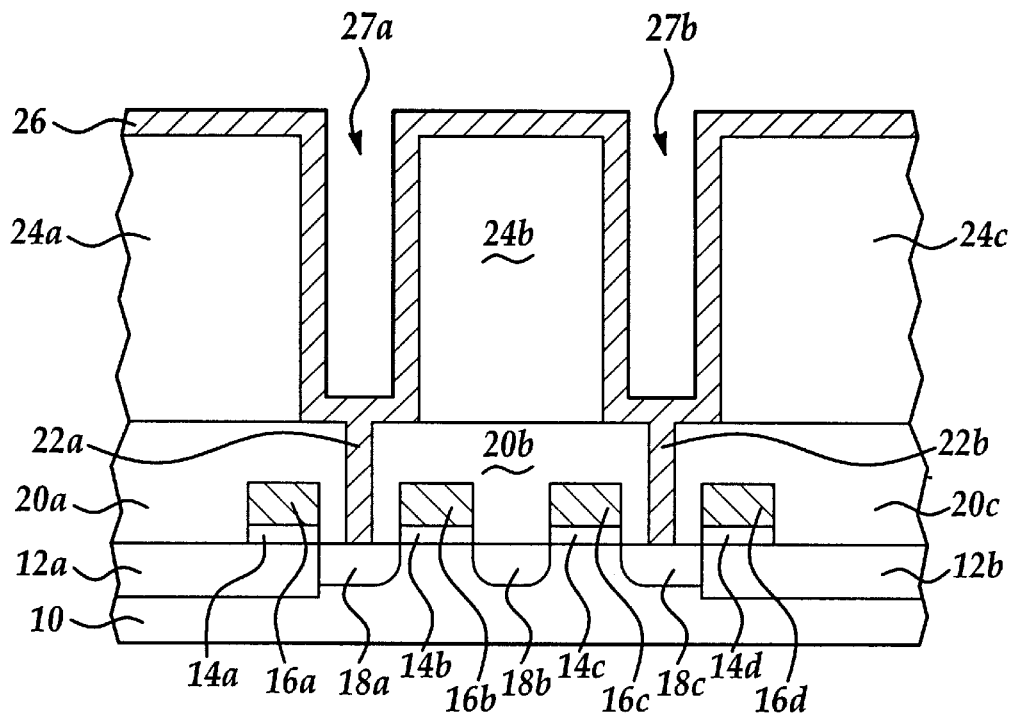
FIG. 1, FIG. 2, FIG. 3 and FIG. 4 show a series of schematic cross-sectional diagrams illustrating the results of progressive stages in forming, in accord with the preferred embodiment of the present invention, a storage capacitor within a dynamic random access memory (DRAM) cell within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a pair of isolation regions 12a and 12b which define an active region of the semiconductor substrate 10. Within the present invention, including the claims, the semiconductor substrate 10 is intended to serve as a horizontal reference plane upon or over which is formed additional vertically spaced layers when forming a capacitor structure in accord with the present invention. The semiconductor substrate 10 need not actually, however, be horizontally disposed when forming those additional vertically spaced layers.

Within the preferred embodiment of the present invention with respect to the semiconductor substrate 10, and although semiconductor substrates are known in the art of semiconductor integrated circuit microelectronic fabrication with either dopant polarity, several dopant concentrations and various crystallographic orientations, for the preferred embodiment of the present invention the semiconductor substrate 10 is typically and preferably a (100) silicon semiconductor substrate having at least either N- or P-doped regions.

Similarly, within the preferred embodiment of the present invention with respect to the pair of isolation regions 12a and 12b, and although it is also known in the art of semiconductor integrated circuit microelectronic fabrication that isolation regions may be formed employing methods including but not limited to isolation regions thermal growth methods and isolation region deposition/patterning methods, for the preferred embodiment of the present invention the isolation regions 12a and 12b are, as is illustrated within the schematic cross-sectional diagram of FIG. 1, formed as shallow trench isolation (STI) regions formed at least in part of a silicon oxide material formed recessed within the semiconductor substrate 10.

Shown also within the schematic cross-sectional diagram of FIG. 1, and formed upon the active region of the semiconductor substrate defined by the pair of isolation regions 12a and 12b, is a pair of field effect transistor (FET) devices comprising: (1) a pair of gate dielectric layers 14b and 14c formed upon the active region of the semiconductor substrate 10; (2) a pair of gate electrodes 16b and 16c formed and aligned upon the pair of gate dielectric layers 14b and 14c; and (3) a series of source/drain regions 18a, 18b and 18c formed within the active region of the semiconductor substrate and separated by the pair of gate electrodes 16b and 16c. Similarly, there is also shown within the schematic cross-sectional diagram of FIG. 1 a pair of interconnect structures which comprises: (1) a pair of interconnect layers 16a and 16d formed upon; (2) a corresponding pair of gate dielectric layers 14a and 14d in turn formed upon; (3) the corresponding pair of isolation regions 12a and 12b.

Within the preferred embodiment of the present invention with respect to each of the foregoing series of structures which comprises the pair of field effect transistor (FET) devices and the pair of interconnect structures, each of the foregoing series of structures which comprises the pair of field effect transistor (FET) devices and the pair of interconnect structures may be formed employing methods and materials as are conventional in the art of semiconductor integrated circuit microelectronic fabrication.

Shown also within the schematic cross-sectional diagram of FIG. 1, and formed passivating the pair of field effect transistor (FET) devices and the pair of interconnect structures, is a series of patterned planarized pre-metal dielectric (PMD) layers 20a, 20b and 20c which defines a pair of first apertures within which is formed a pair of conductive landing studs 22a and 22b.

Within the preferred embodiment of the present invention with respect to the series of patterned planarized pre-metal dielectric layers 20a, 20b and 20c, the series of patterned planarized pre-metal dielectric layers 20a, 20b and 20c is typically and preferably formed at least in part of a silicon oxide dielectric material deposited employing a plasma enhanced chemical vapor deposition (PECVD) method, formed and planarized to a thickness of from about 1.8K to about 4K angstroms while passivating the pair of field effect transistor (FET) devices and the pair of interconnect structures. The planarized dielectric material layer is then patterned to form the pair of first apertures which accesses the pair of source/drain regions 18a and 18c.

Similarly, once having formed the series of patterned planarized pre-metal dielectric (PMD) layers 20a, 20b and 20c, the pair of conductive landing studs 22a and 22b is typically and preferably formed within the pair of first apertures defined by the series of patterned planarized pre-metal dielectric (PMD) layers 20a, 20b and 20c while employing a blanket deposition and chemical mechanical polish (CMP) planarizing method. Although the pair of conductive landing studs 22a and 22b may be formed from any of several conductor materials, including but not limited to metal, metal alloy, doped polysilicon (having a dopant concentration of greater than about 1E18 dopant atoms per cubic centimeter) and polycide (doped polysilicon/metal silicide stack) conductor materials, for the preferred embodiment of the present invention, the pair of conductive landing studs 22a and 22b is typically and preferably formed of a doped polysilicon conductor material.

Shown also within the schematic cross-sectional diagram of FIG. 1, and formed upon the series of patterned planarized pre-metal dielectric (PMD) layers 20a, 20b and 20c, is a series of patterned capacitor node dielectric layers 24a, 24b and 24c which defines a pair of second apertures which leaves exposed upper surface portions of the pair of conductive landing studs 22a and 22b.

Within the preferred embodiment of the present invention, the series of patterned capacitor node dielectric layers 24a, 24b and 24c may be formed of capacitor node dielectric materials as are conventional in the art of microelectronic fabrication, but typically with an etch specificity with respect to the dielectric material from which is formed the series of patterned planarized pre-metal dielectric (PMD) layers 20a, 20b and 20c. To achieve such etch specificity, an upper surface of the series of patterned planarized pre-metal dielectric (PMD) layers 20a, 20b and 20c may optionally be formed of an etch stop material. Typically and preferably, under circumstances where the series of patterned planarized pre-metal dielectric (PMD) layers 20a, 20b and 20c is formed at least in part of a silicon oxide dielectric material deposited employing a plasma enhanced chemical vapor deposition (PECVD) method, the series of patterned capacitor node dielectric layers 24a, 24b and 24c may be formed of a less dense silicon oxide dielectric material formed employing a low pressure chemical vapor deposition (LPCVD) method, or an otherwise lower dielectric constant dielectric material.

Finally, there is shown within the schematic cross-sectional diagram of FIG. 1 a blanket conformal first capacitor plate layer 26 formed conformally upon the series of patterned capacitor node dielectric layers 24a, 24b and 24c and into the pair of second apertures defined thereby, while contacting the pair of conductive landing studs 22a and 22b. Insofar as the blanket first capacitor plate layer 26 is formed conformally and does not completely fill the pair of second apertures, there is formed from the pair of second apertures a corresponding pair of third apertures 27a and 27b.

Although any of several materials may be employed for forming the blanket conformal first capacitor plate layer 26, including but not limited to precious metals and precious metal conductive oxides as are disclosed in greater detail within the references cited within the Description of the Related Art (the disclosures of which are incorporated herein fully by reference), within the preferred embodiment of the present invention the blanket conformal first capacitor plate layer 26 is typically and preferably formed of a ruthenium metal material, formed to a thickness of from about 100 to about 800 angstroms. The ruthenium metal material may be deposited employing methods including but not limited to chemical vapor deposition (CVD) methods and physical vapor deposition (PVD) methods.

Although not specifically illustrated within the schematic cross-sectional diagram of FIG. 1, and in accord with the references cited within the Description of the Related Art, there may optionally be formed a barrier layer interposed between the pair of conductor contact studs 22a and 22b and the blanket conformal first capacitor plate layer 26.

Figure 2:
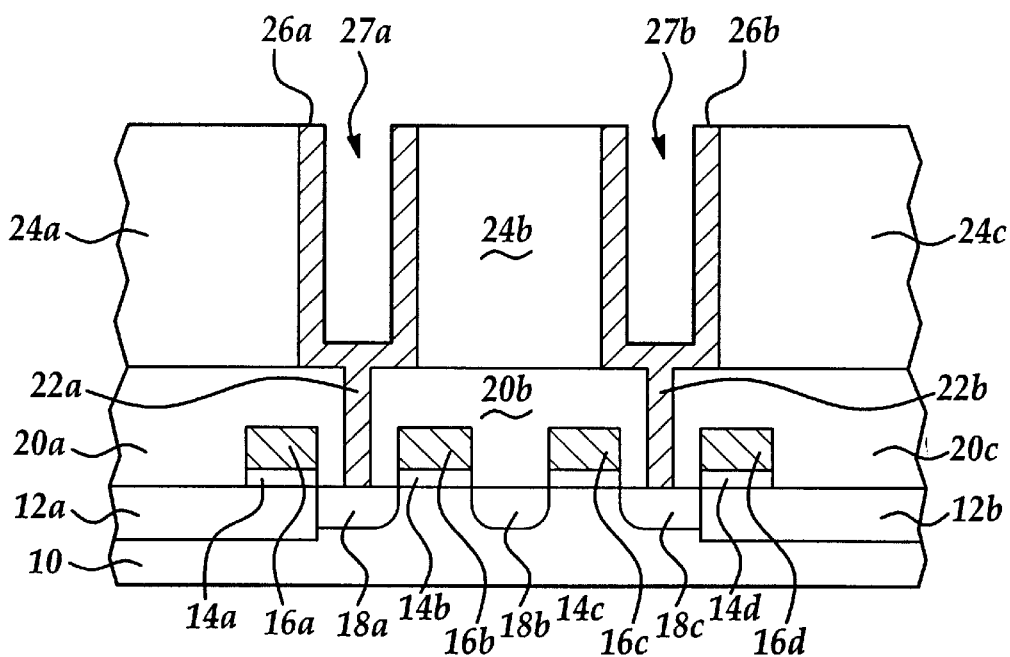

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket conformal first capacitor plate layer 26 has been planarized to form a pair of patterned conformal first capacitor plate layers 26a and 26b.

Within the preferred embodiment of the present invention, the blanket conformal first capacitor plate layer 26 may be planarized to form the pair of patterned conformal first capacitor plate layers 26a and 26b while employing planarizing methods, and in particular chemical mechanical polish (CMP) planarizing methods, as are conventional in the art of semiconductor integrated circuit microelectronic fabrication. Although not specifically illustrated in within the schematic cross-sectional diagrams of FIG. 1 and FIG. 2, there is typically employed a blanket sacrificial layer for purposes of filling the pair of third apertures 27a and 27b when planarizing the blanket conformal first capacitor plate layer 26 to form the pair of patterned conformal first capacitor plate layers 26a and 26b.

Figure 3:
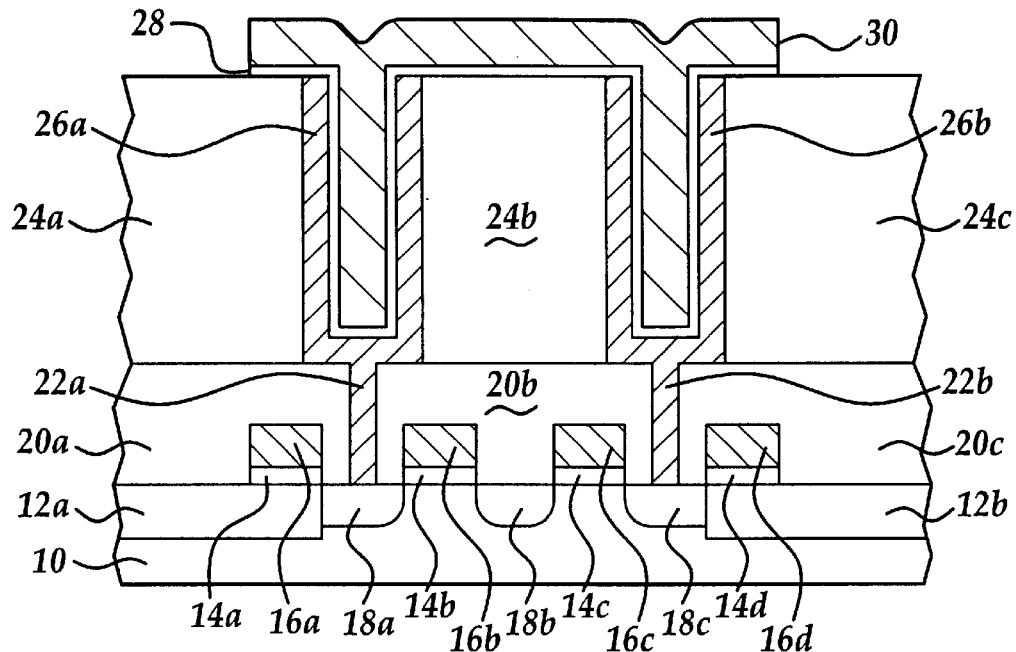

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein there is formed upon the pair of patterned conformal first capacitor plate layers 26a and 26b and spanning over the series of patterned capacitor node dielectric layers 24a, 24b and 24c, while not filling the pair of third apertures 27a and 27b, a patterned capacitor dielectric layer 28. Similarly, there is also shown within the schematic cross-sectional diagram of FIG. 3 formed upon the patterned capacitor dielectric layer 28 a patterned second capacitor plate layer 30 which does fill the pair of third apertures 27a and 27b.

Within the preferred embodiment of the present invention, the patterned capacitor dielectric layer 28 may be formed of capacitor dielectric materials as are conventional in the art of microelectronic fabrication, including but not limited to generally lower dielectric constant dielectric materials (having a dielectric constant in a range of from about 4 to about 8, such as but not limited to silicon oxide dielectric materials, silicon nitride dielectric materials and silicon oxynitride dielectric materials) and in particular higher dielectric constant dielectric (and ferroelectric) materials (having a dielectric constant of from about 20 to about 1000, such as but not limited to barium strontium titanate (BST) dielectric materials and lead zirconate titanate (PZT) dielectric materials) as are disclosed in greater detail within the references cited within the Description of the Related Art, the disclosures of all of which references are incorporated herein fully by reference. Most typically and preferably, the patterned capacitor dielectric layer 28 is formed of a tantalum oxide dielectric material formed to a thickness of from about 30 to about 250 angstroms. In particular when formed upon a patterned conformal first capacitor plate layer 26a or 26b formed of a ruthenium metal material, the tantalum oxide dielectric material exhibits an enhanced dielectric constant of from about 40 to about 70 (rather than about 20 to about 25), presumably due to a crystal structure of the ruthenium metal material.

Within the preferred embodiment of the present invention, the patterned second capacitor plate layer 30 may also be formed employing methods and materials as are conventional in the art of microelectronic fabrication, and as are disclosed in greater detail within the references cited within the Description of the Related Art. Typically and preferably, the patterned second capacitor plate layer 30 is also formed of a ruthenium metal material formed to a thickness of from about 100 to about 800 angstroms.

Figure 4:
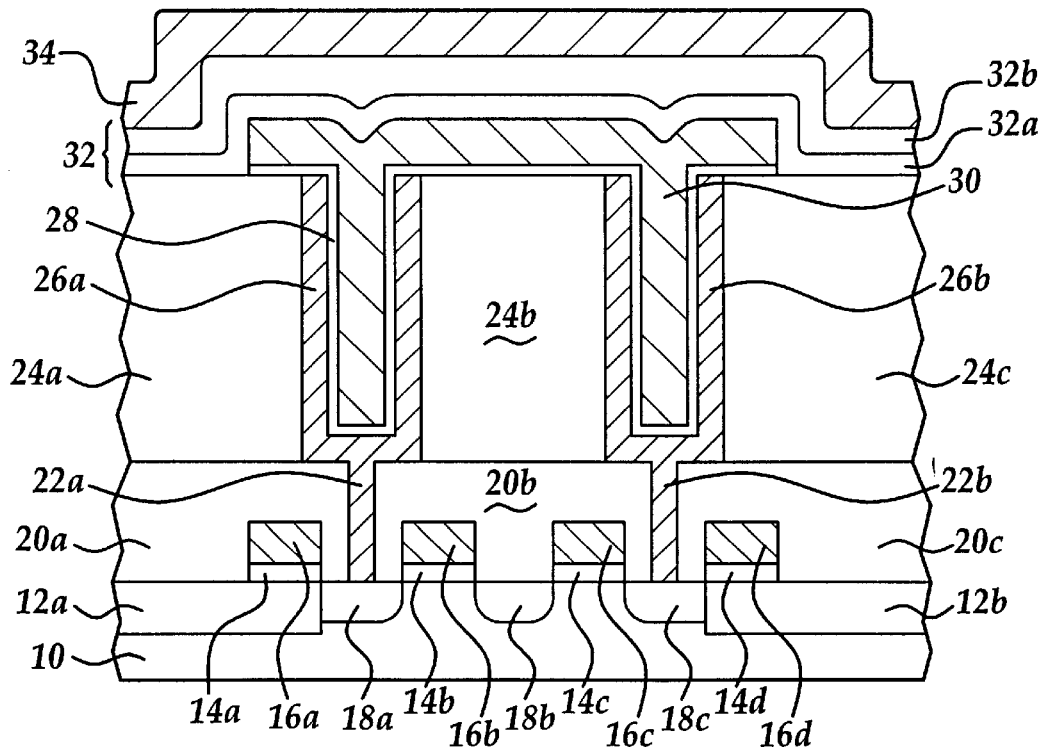

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein: (1) there is formed passivating exposed portions of the patterned second capacitor plate layer 30 and the patterned capacitor dielectric layer 28 a blanket conductor barrier layer 32 which spans over portions of the patterned capacitor node dielectric layers 24a and 24c; and (2) there is formed upon the blanket conductor barrier layer 32 a blanket silicon layer 34, which serves as an additional barrier layer.

Within the preferred embodiment of the present invention with respect to the blanket conductor barrier layer 32, and as is illustrated within the schematic cross-sectional diagram of FIG. 4, the blanket conductor barrier layer 32 is typically and preferably formed as a bilayer conductor barrier layer comprising a blanket lower conductor sub-barrier layer 32a having formed thereupon a blanket upper conductor sub-barrier layer 32b, although single layer conductor barrier layers are not precluded within the present invention. Similarly, although any of several bilayer conductor barrier materials compositions may be employed for forming the blanket conductor barrier layer 32, including but not limited to metal nitride conductor barrier materials having formed thereupon corresponding metal conductor barrier materials (such as but not limited to tantalum nitride/tantalum bilayer composite barrier materials, titanium nitride/titanium bilayer composite barrier materials and titanium-tungsten alloy nitride/titanium-tungsten alloy bilayer composite barrier materials) for the preferred embodiment of the present invention, and in accord with the examples which follow, the blanket barrier layer 32 is typically and preferably formed of a titanium-tungsten alloy nitride blanket lower conductor sub-barrier layer 32a having formed thereupon a titanium-tungsten alloy blanket upper conductor sub-barrier layer 32b. Typically and preferably, the blanket lower conductor sub-barrier layer 32a is formed to a thickness of from about 5 to about 400 angstroms, while the blanket upper conductor sub-barrier layer 32b is formed to a thickness of from about 5 to about 400 angstroms.

Typically and preferably, the titanium-tungsten alloy nitride material which comprises the blanket lower conductor sub-barrier layer 32a is formed by sputtering an about 5–15 weight percent titanium in tungsten target within an about 5–15 volume percent nitrogen in argon atmosphere to form the layer upon a substrate held at a temperature of from about 250 to about 500 degrees centigrade, in order to provide optimal properties within the titanium-tungsten alloy nitride material. The titanium-tungsten alloy material which comprises the blanket upper conductor sub-barrier layer 32b may be formed employing an analogous sputtering method, but with a pure argon sputtering atmosphere rather than an argon/nitrogen sputtering atmosphere.

Within the preferred embodiment of the present invention with respect to the blanket silicon layer 34, the blanket silicon layer 34 is typically and preferably formed of an undoped (i.e., non-conductive) polysilicon material formed to a thickness of from about 300 to about 2000 angstroms, although under certain circumstances a doped (i.e., conductive) polysilicon material may also be employed. The polysilicon material may be formed employing a chemical vapor deposition (CVD) method as is otherwise conventional in the art of microelectronic fabrication.

As is understood by a person skilled in the art, the semiconductor integrated circuit microelectronic fabrication whose schematic cross-sectional diagram is illustrated in FIG. 4 may be further fabricated while employing methods and materials as are conventional in the art, to form therefrom a fully fabricated dynamic random access memory (DRAM) semiconductor integrated circuit microelectronic fabrication. In so doing, and under circumstances wherein the source/drain region 18b does not have formed contacting thereto a bitline stud layer beneath the capacitor structure which comprises: (1) the pair of patterned first conformal capacitor plate layers 26a and 26b; (2) the patterned capacitor dielectric layer 28; and (3) the patterned second capacitor plate layer 30, the later two of the foregoing layers will be penetrated to form a bitline stud layer within a capacitor under bitline (CUB) dynamic random access memory (DRAM) memory cell structure.

As is further understood by a person skilled in the art, by providing within the preferred embodiment of the present invention the blanket barrier layer 32 passivating the patterned upper capacitor plate layer 30, there is avoided within the preferred embodiment of the present invention interdiffusion of a capacitor plate material from which is formed the patterned capacitor plate layer 30 with overlying layers within a semiconductor integrated circuit microelectronic memory fabrication formed incident to further processing of the semiconductor integrated circuit microelectronic memory fabrication whose schematic cross-sectional diagram is illustrated in FIG. 4. Similarly, by also employing within the preferred embodiment of the present invention the blanket silicon layer 34 formed upon the blanket barrier layer 32, there is provided enhanced adhesion and enhanced barrier properties within the semiconductor integrated circuit microelectronic fabrication whose schematic cross-sectional diagram is illustrated in FIG. 4.

EXAMPLES

There was obtained a series of four silicon semiconductor substrates and formed over each silicon semiconductor substrate a tantalum oxide dielectric layer formed employing a chemical vapor deposition (CVD) method as is otherwise conventional in the art of microelectronic fabrication. Each of the series of four tantalum oxide dielectric layers was formed to a thickness of about 150 angstroms.

Formed upon each of the series of tantalum oxide dielectric layers was a ruthenium metal layer formed to a thickness of about 500 angstroms. Each of the series of ruthenium metal layers was formed employing an argon ion sputtering of a ruthenium metal target, while employing an otherwise conventional sputtering method.

Formed upon a first of the series of ruthenium metal layers formed over a first of the series of semiconductor substrates was an undoped polysilicon layer formed to a thickness of about 1000 angstroms. The polysilicon layer was formed employing a convention low pressure chemical vapor deposition (LPCVD) method in turn employing silane as a silicon source material.

Formed upon a second, a third and a fourth of the series of ruthenium metal layers was a series of bilayer barrier layers comprising either: (1) a tantalum nitride material layer having formed thereupon a tantalum material layer; (2) a titanium nitride material layer having formed thereupon a titanium material layer; or (3) a titanium-tungsten alloy nitride material layer having formed thereupon a titanium-tungsten alloy material layer. With respect to each of the foregoing bilayer barrier layers, the nitride material layers were formed to a thickness of about 150 angstroms, while the metal or metal alloy material layers were formed to a thickness of about 100 angstroms. The metal nitride material layers were formed employing an argon/nitrogen sputtering method in accord with the preferred embodiment of the present invention, while the metal or metal alloy material layers were formed employing a pure argon sputtering method, also in accord with the preferred embodiment of the present invention.

There was then formed upon the metal or metal alloy material layers formed over the second, the third and the fourth semiconductor substrates a polysilicon layer formed employing methods, materials and dimensions equivalent to the methods, materials and dimensions employed for forming the polysilicon layer over the first semiconductor substrate.

Each of the four semiconductor substrates was then exposed to an $N_2$ atmosphere at a temperature of about 750 degrees centigrade for a time period of about 1 minute. There was then measured, while employing a conventional scanning electron microscopy (SEM) method, areal delamination of the series of polysilicon layers from the corresponding series of substrate layers. The results of the delamination measurements are reported in Table I, as follows.

TABLE I

| Laminate | Area 1% Delamination |
|---|---|
| Ta2O5/Ru/PolySi | 50% |
| Ta2O5/Ru/TaN/Ta/PolySi | 15% |
| Ta2O5/Ru/TiN/Ti/PolySi | 25% |
| Ta2O5/Ru/TiWN/TiW/PolySi | 0.4% |

As is seen from review of the data in Table I, a bilayer barrier layer composition in accord with the present invention provides for attenuated delamination of a polysilicon barrier layer from a capacitor structure (or more particularly a ruthenium upper capacitor electrode layer within the capacitor structure), and thus enhanced reliability and enhanced performance of the capacitor structure.

As is understood by a person skilled in the art, the preferred embodiment and examples of the present invention are illustrative of the present invention rather than limiting of the present invention. Revisions and modifications may be made to methods, materials, structures and dimensions through which is provided a semiconductor integrated circuit microelectronic fabrication in accord with the preferred embodiment and examples of the present invention, while still providing a method for fabricating a capacitor structure, and a capacitor structure fabricated in accord with the method, further in accord with the accompanying claims.

What is claimed is:

1. A capacitor structure comprising:

a substrate;

a first capacitor plate formed over the substrate;

a capacitor dielectric layer formed upon the first capacitor plate;

a second capacitor plate formed upon the capacitor dielectric layer;

a conductor barrier layer formed upon the second capacitor plate; and a non-conductive silicon layer formed upon the conductor barrier layer.

2. The capacitor structure of claim 1 wherein the first capacitor plate and the second capacitor plate are formed from conductor materials selected from the group consisting precious metals and precious metal conductive oxides.

3. The capacitor structure of claim 1 wherein the conductor barrier layer comprises a bilayer comprising a metal nitride material layer having formed thereupon a metal layer.

4. A capacitor structure comprising:

a substrate;

a first capacitor plate formed over the substrate;

a capacitor dielectric layer formed upon the first capacitor plate;

a second capacitor plate formed upon the capacitor dielectric layer, the second capacitor plate being formed of a ruthenium material;

a conductor barrier layer formed upon the second capacitor plate; and a non-conductive silicon layer formed upon the conductor barrier layer.

5. The capacitor structure of claim 4 wherein the conductor barrier layer comprises a bilayer comprising a metal nitride material layer having formed thereupon a metal layer.

6. The capacitor structure of claim 4 wherein the conductor barrier layer is formed to a thickness of from about 10 to about 800 angstroms.

* * * * *